United States Patent
Kondrus et al.

(10) Patent No.: US 11,969,613 B2
(45) Date of Patent: Apr. 30, 2024

(54) EXPLOSION-PROOF HOUSING

(71) Applicant: R. STAHL SCHALTGERÄTE GMBH, Waldenburg (DE)

(72) Inventors: Elena Kondrus, Künzelsau (DE); Jürgen Schmitt, Öhringen (DE); Natascha Sekinger, Baierbach (DE); Otto Walch, Gerabronn (DE); Christian Kochendörfer, Schwäbisch Hall (DE); Bernd Limbacher, Schwäbisch Hall (DE)

(73) Assignee: R. STAHL SCHALTGERÄTE GMBH, Waldenburg (DE)

( * ) Notice: Subject to any disclaimer, the term of this patent is extended or adjusted under 35 U.S.C. 154(b) by 432 days.

(21) Appl. No.: 17/271,508

(22) PCT Filed: Aug. 9, 2019

(86) PCT No.: PCT/EP2019/071488
§ 371 (c)(1),
(2) Date: Feb. 25, 2021

(87) PCT Pub. No.: WO2020/043468
PCT Pub. Date: Mar. 5, 2020

(65) Prior Publication Data
US 2021/0170210 A1 Jun. 10, 2021

(30) Foreign Application Priority Data
Aug. 27, 2018 (DE) .................. 10 2018 120 877.4

(51) Int. Cl.
*A62C 3/16* (2006.01)
*E05G 1/024* (2006.01)
*H05K 7/20* (2006.01)

(52) U.S. Cl.
CPC ............ *A62C 3/16* (2013.01); *E05G 1/024* (2013.01); *H05K 7/20136* (2013.01)

(58) Field of Classification Search
CPC .. A62C 3/16; A62C 4/00; E05G 1/024; E05G 1/00; H05K 7/20136; H06K 5/04;
(Continued)

(56) References Cited

U.S. PATENT DOCUMENTS

| 2,789,238 A | 4/1957 | Staak |
| 4,180,177 A | 12/1979 | Gunderman et al. |

(Continued)

FOREIGN PATENT DOCUMENTS

| CN | 102695403 A | 9/2012 |
| CN | 103346491 A | 10/2013 |

(Continued)

OTHER PUBLICATIONS

English Translation to International Search Report for Application No. PCT/EP2019/071488.
(Continued)

*Primary Examiner* — Suzanne L Barrett
(74) *Attorney, Agent, or Firm* — CANTOR COLBURN LLP

(57) ABSTRACT

An explosion-proof housing having external walls, which enclose a housing interior so as to be proof against ignition penetration relative to an atmosphere at risk of explosion. At least one insert is arranged in at least one outer wall. The insert facilitates a gas flow between the housing interior and an environment around the housing. The at least one insert is configured in such a way that a gas flow having a sufficient mass flow or volumetric flow rate is permitted, but a flow connection which is proof against ignition penetration is produced. Attached to the outer wall having the at least one insert is a guiding means which together with the relevant
(Continued)

outer wall delimits a flow channel. The flow channel defines a main flow direction of a main gas flow through the flow channel substantially parallel to the directly adjoining outer wall. In this way, the gas exchange between the environment and the housing interior can be improved and facilities arranged in the housing interior can be cooled.

20 Claims, 5 Drawing Sheets

(58) Field of Classification Search
CPC .......... H06K 5/00; H06K 5/06; H06K 5/0008; H06K 5/12
USPC ........................................................... 109/27
See application file for complete search history.

(56) References Cited

U.S. PATENT DOCUMENTS

| | | | |
|---|---|---|---|
| 4,484,690 A | | 11/1984 | Nash |
| 5,988,264 A | | 11/1999 | Goldsmith |
| 6,354,181 B1 | * | 3/2002 | Donovan ............... F42D 5/045 |
| | | | 110/237 |
| 8,171,837 B2 | * | 5/2012 | Asahina .................. F42D 5/045 |
| | | | 86/50 |
| 8,939,524 B2 | | 1/2015 | Gasser |
| 8,987,592 B2 | | 3/2015 | Mack et al. |
| 8,992,649 B2 | | 3/2015 | Manahan et al. |
| 9,403,326 B2 | | 8/2016 | Mann et al. |
| 9,478,951 B2 | | 10/2016 | Faber et al. |
| 9,908,679 B2 | | 3/2018 | Limbacher et al. |
| 2010/0284150 A1 | | 11/2010 | Manahan et al. |
| 2011/0292575 A1 | * | 12/2011 | Franco ................. H02B 13/025 |
| | | | 361/622 |
| 2013/0206759 A1 | * | 8/2013 | Wurz ...................... A62C 3/00 |
| | | | 220/88.2 |
| 2013/0312948 A1 | | 11/2013 | Manahan |
| 2015/0060465 A1 | | 3/2015 | Limbacher et al. |
| 2020/0298037 A1 | | 9/2020 | Hjelmsen |

FOREIGN PATENT DOCUMENTS

| | | | | |
|---|---|---|---|---|
| CN | 104283132 A | | 1/2015 | |
| CN | 104833622 A | | 8/2015 | |
| CN | 103260710 B | | 1/2016 | |
| CN | 204967012 U | | 1/2016 | |
| CN | 205282939 U | | 6/2016 | |
| CN | 103328048 B | | 9/2016 | |
| CN | 106848866 A | | 6/2017 | |
| CN | 107069484 A | | 8/2017 | |
| CN | 206697792 U | | 12/2017 | |
| CN | 207368525 U | | 5/2018 | |
| CN | 104427813 B | | 6/2018 | |
| CN | 104427808 B | | 11/2018 | |
| CN | 105743007 B | | 5/2019 | |
| CN | 112514186 A * | | 3/2021 | ............... H02B 1/28 |
| DE | 2817418 A1 | | 10/1979 | |
| DE | 112010002654 | | 6/2012 | |
| DE | 102012102468 A1 | | 9/2013 | |
| DE | 102012110001 A1 * | | 4/2014 | ............... H01H 9/042 |
| DE | 102017112153 A1 * | | 12/2018 | ............... H02B 1/28 |
| DE | 102018120877 A1 | | 2/2020 | |
| DE | 102019116164 B3 * | | 12/2020 | ............... A62C 3/16 |
| KR | 20140062781 A | | 5/2014 | |
| RU | 2593837 C2 | | 8/2016 | |
| SU | 1165802 A1 | | 7/1985 | |
| WO | 2013139688 A2 | | 9/2013 | |
| WO | 2014060528 A1 | | 4/2014 | |
| WO | WO-2020035375 A1 * | | 2/2020 | ............... A62C 4/00 |
| WO | WO-2020156848 A1 * | | 8/2020 | ............... H02B 1/28 |
| WO | WO-2020233982 A1 * | | 11/2020 | ............... H02B 1/28 |

OTHER PUBLICATIONS

German Office Action for Application No. 10 2018 120 877.4; dated May 13, 2019.
International Search Report for Application No. PCT/EP2019/071488.
Written Opinion for Application No. PCT/EP2019/071488.
Office Action dated Jan. 11, 2023; Issued in Chinese Application No. 201980056548.9; 13 pages; English translation included.
Office Action dated Dec. 13, 2022; Russian Application No. 2021105754/07, Filed Aug. 9, 2019; 11 pages; Non-English.
Indian Patent Office Action for Indian Application No. 202117007020, dated Apr. 8, 2022, 1 Page (No Machine Translation).
Chinese Office Action dated Oct. 28, 2023; Chinese Application No. 201980056548.9; 9 pages (non-English).
"Practical study on flame propagation accelerated by baffle obstacles and overpressure changes", Journal of China Coal Science, vol. 27, No. 6, Dec. 2002, 5 pages.
Chinese Patent Office Decision to Grant for corresponding CN Application No. 201980056548.9; Mailing Date, Feb. 2, 2024.

* cited by examiner

US 11,969,613 B2

EXPLOSION-PROOF HOUSING

CROSS REFERENCE TO RELATED APPLICATIONS

This application is a National Stage of PCT Application No. PCT/EP2019/071488 filed on Aug. 9, 2019, which claims priority to German Patent Application No. 10 2018 120 877.4 filed on Aug. 27, 2018, the contents each of which are incorporated herein by reference thereto.

BACKGROUND

The invention refers to an explosion-proof housing. The housing is configured to house devices in the housing interior that could serve as ignition sources in explosive atmospheres. The explosion-proof housing separates the housing interior in an explosion-proof manner from the explosive atmosphere in an environment.

Such a housing is known from U.S. Pat. No. 4,180,177 A, for example. In this housing an insert for pressure relief is provided in an outer wall by means of which a gas exchange between the housing interior and the environment can occur. In doing so, an explosion pressure in the housing interior can be reduced such that the integrity of the housing is maintained also in the event of an explosion. On the outside the insert is covered by a flap. The cover only opens in the case of a remarkable overpressure in the housing interior.

The heat dissipation out of the housing interior into the environment is problematic in explosion-proof housings, if heat sources are arranged in the housing, as for example electrical and/or electronic devices. It has to be avoided that the devices become inoperative due to too high temperatures. In addition, it has to be avoided that the outer walls of the housing have a temperature that in turn may serve as ignition source for the explosive atmosphere. Pressure relief devices are insufficient for such a heat dissipation.

The heat dissipation from an explosion-proof housing is usually elaborate and expensive. For example, heat exchangers can be used in order to transport heat by means of an explosion-proof fluid circuit from the housing interior to the outside. Due to such measures, besides the high costs for manufacturing or purchase, additional costs occur for service and maintenance.

BRIEF SUMMARY

Thus, it can be considered as object of the invention to provide an explosion-proof housing that allows a heat exchange between a housing interior and an environment with simple means.

An explosion-proof housing, comprising: a plurality of outer walls that enclose a housing interior and separate it in an explosion-proof manner from an explosive atmosphere in an environment; at least one gas-permeable flameproof insert provided in at least one of the plurality of outer walls, the at least one gas-permeable flameproof insert having an inner side facing the housing interior and an outer side facing the environment; at least one guide device defining a flow channel adjacent to either the inner side or the outer side of the at least one gas-permeable flameproof insert in which gas flows through the at least one gas-permeable flameproof insert; and wherein the at least one guide device is configured to form a main gas flow having a main gas flow direction along the outer side or the inner side of the at least one gas-permeable flameproof insert in the flow channel.

The explosion-proof housing has several outer walls that surround a housing interior and separate the housing interior in an explosion-proof manner from an explosive atmosphere in an environment of the housing. Thereby the housing interior is not enclosed in a gas-tight manner. Rather in at least one outer wall at least one gas-permeable and flameproof insert is provided. The insert provides a flameproof gas exchange between the housing interior and the environment. It thus forms a flameproof through channel for a gas flow. For example, the flameproof insert can comprise a porous or a mesh comprising structure part, e.g. an entangled fiber structure part. In another embodiment one or more grid layers can be arranged on top of one another in order to form a grid for the structure part. The gas-permeable ignition-flameproof insert can have an average mesh or pore dimension in the range of about 80 µm to 250 µm. The thickness of the gas-permeable flameproof insert in gas flow direction has an amount of at least 5 mm or at least 10 mm, for example. Preferably the insert is manufactured from a material that has a temperature resistance of at least 400° C. For example, the insert can be manufactured from chromium alloy steel, such as stainless steel. The insert can comprise an entangled fiber structure and/or grid structure and/or another porous structure in order to allow the gas exchange on one hand and to inhibit the escape of hot gases, sparks or flames on the other hand that could initiate an ignition in the explosive atmosphere.

The insert has an inner side facing the housing interior and an outer side facing the environment. The housing comprises at least one guide device that is arranged adjoining the respective inner side or outer side of the at least one insert and forms a flow channel there. Gases flow out of the housing interior or out of the environment through the at least one insert into the flow channel. In doing so, either warm gas or warm air can flow out of the housing interior outwardly into the flow channel. Alternatively, cooler gas or cooler air can flow from the outside into the housing interior. The guide device is configured to define a main gas flow having a main gas flow direction in the flow channel. The main gas flow direction is thereby orientated obliquely or orthogonal to the direction in which the gas flows through the at least one insert into the flow channel. The main gas flow direction is orientated substantially parallel to the respective adjoining outer side or inner side of the at least one insert and/or parallel to the adjacent outer wall of the housing.

Due to this arrangement, a suction or chimney effect is created in the flow channel. In doing so, an effective gas flow can be created without additional active flow creation devices (such as fans, pumps or the like) that in turn improves the gas exchange and thus the heat exchange between the environment and the housing interior. At least optionally present active flow creation devices can be defined with minor dimensions. In doing so, the energy efficiency is improved and less additional heat is created. Because each active flow creation device involves energy losses and creates additional heat that in turn has to be dissipated in the environment. If such devices are arranged outside the housing interior, they have to be configured in an explosion-proof manner.

Preferably the explosion-proof housing does not contain any cooling fluid circuits.

The gas flows are created either exclusively by means of convection and/or by optionally additional fans.

It is advantageous, if the flow channel is orientated such that the main flow direction is orientated parallel to the vertical or comprises at least a vertical direction component, wherein the vertical direction component is preferably greater than the horizontal direction component.

In an alternative embodiment the main flow direction can also be horizontal or substantially horizontal. In this case it is preferred, if the gas flow through the at least one insert is orientated substantially vertically.

In a preferred embodiment the guide device is arranged outside the housing interior and is closed to the top, e.g. by means of a cover. In doing so, the ingress of precipitation or the like into the flow channel can be avoided.

Preferably the length of the flow channel in main flow direction has an amount of at least 50% to 75% of the length of the adjacent outer wall of the housing in the main flow direction. For example, the flow channel can extend in main flow direction substantially along the entire adjacent outer wall or also beyond it.

It is advantageous, if the cross-section of the flow channel in each spatial direction within the cross-sectional plane has a smaller dimension than the length of the flow channel orthogonal to the cross-sectional plane.

It is preferred, if the cross-section of the flow channel is smaller than the sum of all outer surfaces of the inserts adjoining the flow channel or smaller than the outer surface adjoining the flow channel, if only one insert is present.

It is advantageous, if the flow channel has a channel inlet and a channel outlet that is arranged with distance to the channel inlet in main flow direction. Preferably the channel inlet and the channel outlet are arranged in main flow direction as far as possible away from each other.

In an embodiment the channel inlet and the channel outlet can open into the environment. Thereby the at least one insert can be arranged between the channel inlet and the channel outlet in main flow direction. In doing so, a main flow through the flow channel is created that flows from the channel inlet along all of the present inserts up to the channel outlet. In this configuration a good suction effect is created in order to effectuate gas flows through the inserts.

In another embodiment the channel inlet and/or the channel outlet can be formed by one or more or all of the present inserts. For example, the flow channel is open to the environment in this configuration only at one location, wherein this location forms either the channel outlet or the channel inlet.

It is particularly advantageous, if the flow channel is closed between the channel inlet and the channel outlet or gas flows in or out of the flow channel only through the at least one present insert between the channel inlet and the channel outlet. In doing so, it is achieved that no additional air is sucked from the environment, but that a sufficiently strong suction is achieved for the gas exchange through the at least one insert.

Specifically the guide device can be open at one side facing the at least one insert in order to establish a gas flow connection between the insert and the flow channel. In addition, the flow channel can have one or more openings in order to form a channel inlet or a channel outlet or a channel inlet as well as a channel outlet. Apart from these defined gas flow openings, the flow channel is preferably closed.

The expression "closed" does not exclusively, but amongst others mean a gas tight configuration. Minor gas leakages having a negligible volume flow or mass flow compared with the main flow in the flow channel may be present, e.g. leakage flows due to gas leakages having a volume or mass flow that has an amount of not more than 10% of the volume or mass flow of the main gas flow through the flow channel.

It is advantageous, if multiple separate flow channels are provided, such that a good heat exchange can be achieved at multiple locations, e.g. at opposite outer walls of the housing.

In an embodiment a separate gas channel can be provided that is in flameproof flow connection with the housing interior. Air or gas can be supplied into the housing interior or can be sucked out of the housing interior through this gas channel. For this the gas channel can be in connection with a fan that can be arranged either inside the housing interior or outside the housing interior. The gas channel can be open either in the explosive atmosphere or in a non-explosive safe atmosphere.

In a preferred embodiment the housing is configured in the ignition protection category "flameproof enclosure" (Ex-d) according to the standards EN 60079-1 or IIC 60079-1.

In an embodiment at least one insert is arranged in an upper outer wall of the housing. In another embodiment at least one insert is arranged in at least one lateral outer wall. Particularly one or more inserts can be provided in opposite lateral outer walls respectively. Also a combination of at least one insert in an upper outer wall and at least one insert in at least one lateral outer wall is advantageous. Generally, at least one insert can be present in an arbitrary combination of the provided outer walls respectively. Inside or outside one flow channel or as an option the additional gas channel can adjoin the respective outer wall of the housing respectively.

In an embodiment the flow channel is arranged inside the housing interior. Thereby the guide device comprises an attachment surface for a device to be cooled that is arranged in the housing interior, e.g. an electrical and/or an electronic device. In addition, or as an alternative, a section of the flow channel or the guide device can be formed by a wall of a device arranged in the housing interior. In doing so, a particularly good heat transfer between the wall of the device arranged in the housing interior and the gas flow inside the flow channel can be achieved.

Advantageous embodiments of the invention are derived from the dependent claims, the description and the drawings. In the following preferred embodiments of the invention are explained in detail based on the attached drawings.

DETAILED DESCRIPTION

Figure 1:
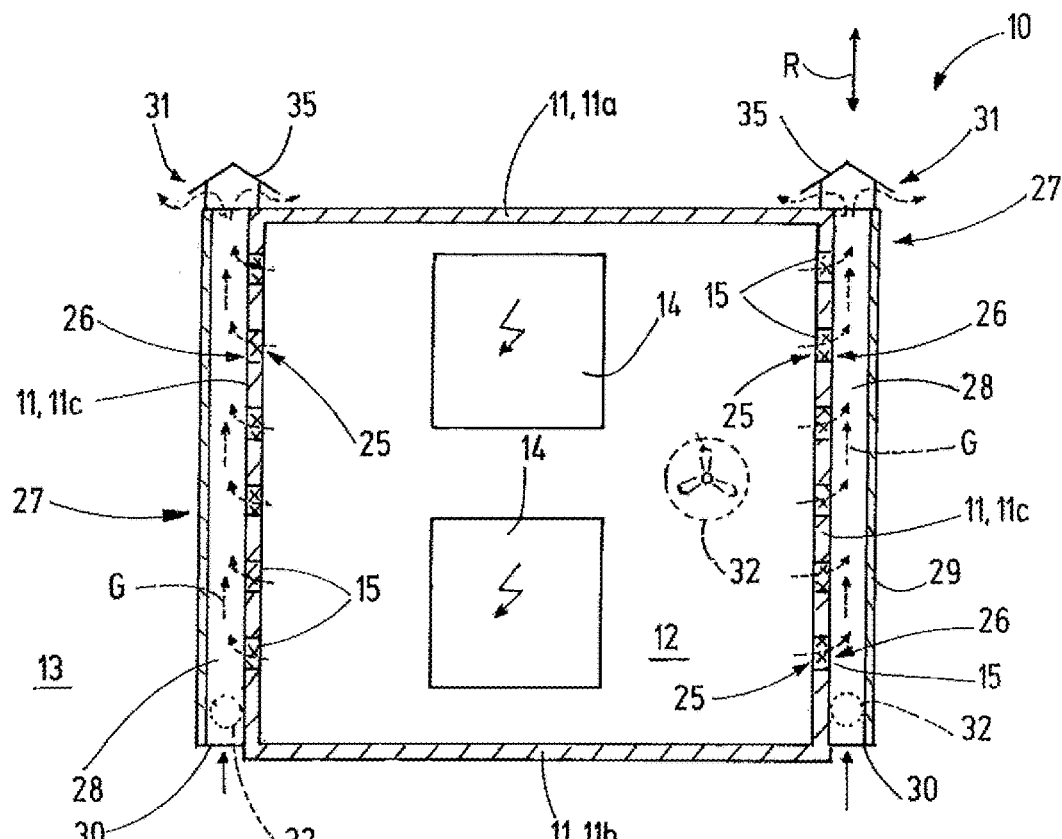
FIG. 1 a schematic block-diagram-like illustration of an embodiment of an explosion-proof housing, FIG. 2 a perspective sectional illustration of another embodiment of an explosion-proof housing, FIG. 3 a schematic block-diagram-like illustration of another embodiment of an explosion-proof housing, FIG. 4 a perspective illustration of the embodiment according to the block diagram of FIG. 3, FIG. 5 a perspective illustration of another embodiment of an explosion-proof housing, FIG. 6 a sectional illustration of the embodiment of FIG. 5 in perspective view, FIG. 7 a perspective illustration of another embodiment of an explosion-proof housing, FIG. 8 a perspective sectioned illustration of the embodiment of FIG. 7 and FIGS. 9 and 10 schematic perspective illustrations respectively of a gas-permeable flameproof structure for an insert, as can be used in any embodiment of the explosion-proof housing.

FIG. 1 shows an embodiment of an explosion-proof housing 10 with multiple outer walls 11 that enclose a housing interior 12. In the embodiment the housing 10 has an upper outer wall 11a, a lower outer wall 11b and multiple, e.g. four lateral outer walls 11c that connect the upper outer wall 11a and the lower outer wall 11b with each other. The housing interior 12 is substantially cuboid-shaped, whereby also arbitrary other housing construction shapes could be used, such as other prismatic housing shapes or cylindrical housing shapes.

In the embodiment described here, the explosion-proof housing 10 is configured in the explosion-proof category "flameproof enclosure" (Ex-d).

The outer walls 11 separate the housing interior 12 from an environment 13 having an explosive atmosphere in a flameproof manner. A gas exchange occurs between the housing interior 12 and the environment 13 in order to dissipate heat by means of the gas flow from the housing interior 12 outward in the environment 13. At least one device 14 is arranged in the housing interior, particularly an electrical and/or electronic device 14 that may serve as ignition source for the explosive atmosphere in the environment 13. The device 14 is thus enclosed by housing 10 such that sparks, flames or hot gases from the housing interior 12 cannot escape into the environment 13. During operation of the at least one device 14 heat is created in the housing interior 12 that can be dissipated in the environment 13 by means of the gas exchange.

In order to allow this gas exchange, at least one outer wall 11 of the housing 10 comprises a gas-permeable flameproof insert 15. As schematically illustrated in FIG. 1, in one outer wall 11 and for example in two lateral outer walls 11c, also multiple of such inserts 15 can be provided respectively. It is also possible to use one large insert 15 instead of multiple small area inserts 15 that is held by means of suitable holding means, e.g. a holding grid, in an opening of the respective outer wall 11. A multiplicity of possibilities exist for the mechanical arrangement of the at least one insert 15 in a respective outer wall 11. Either the at least one insert 15 can be mechanically attached by holding means. The insert 15 can be directly or indirectly connected with the surrounding area of the outer wall 11 in a force-fit and/or form-fit and/or material bond manner or by means of an adhesive connection.

According to the example, the at least one insert 15 is formed by a porous and/or mesh comprising material structure that allows a gas exchange through the material structure and extinguishes on the other hand flames, sparks and hot gases. The material structure therefore fulfills the flameproof condition and allows, however, a gas flow through the material structure. For example, the material structure can be formed by a porous structure part 16. The porous structure part 16 can comprise an entangled fiber structure material. It comprises entangled disorderly arranged fibers that can have a diameter of 70 μm to 130 μm. Alternatively the porous structure part 16 can comprise porous sinter material and/or foam material or the like. The pore size of the porous structure part 16 can be at least 80 μm and at most 250 μm. The porosity of the porous structure part 16 is preferably in a range of 60% to 80%.

Figure 10:
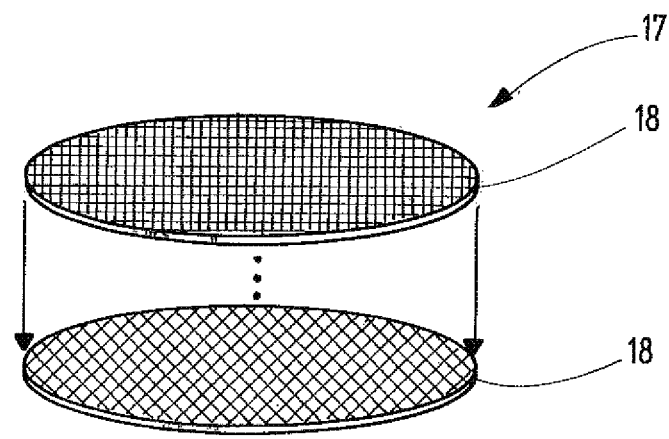

FIG. 10 illustrates an alternative embodiment of a material structure that could be used as insert 15. The material structure according to FIG. 10 is configured as mesh or grid structure part 17. The mesh size has an amount of about at least 80 μm and at most 250 μm. For example, multiple single layers 18 can be arranged on top of one another and can be connected directly or indirectly with one another for creating the mesh size. Thereby the grid rod orientations of each layer 18 relative to another layer can be arranged in a different angle and/or offset in order to obtain the desired effective mesh size of the grid structure part 17. The number of layers 18 can vary depending on the configuration of each single layer.

Each insert can also comprise a combination of a porous structure part 16 and a grid structure part 17.

Each insert 15 comprises an inner side 25 facing the housing interior, as well as an outer side 26 facing the environment. The housing 10 comprises one guide device 27 respectively that forms a flow channel 28 adjoining the insert 15 on an outer wall 11 and according to the example, the lateral outer walls 11c in which at least one insert 15 is provided respectively. In the embodiment illustrated in FIG. 1, the flow channels 28 and the guide device 27 are arranged outside the housing interior 12 and attached on the outside of the respective lateral outer walls 11c. At one location the respective flow channel 28 is at least partly limited by the outer wall 11. In each flow channel 28 a main gas flow G is effectuated that flows in a main flow direction R. In a preferred embodiment the main flow direction R can be orientated vertically or can comprise a vertical component that is preferably greater than the horizontal component of the main flow direction R.

Each guide device 27 has multiple guide walls 29 that enclose the flow channel 28 in circumferential direction around the main flow direction R at least partly only on three sides and limit the flow channel 28 together with the adjacent lateral outer wall 11c. In the embodiments illustrated in FIGS. 1 and 2 each flow channel 28 is in flow connection with the environment 13 at two opposite ends in main flow direction R, whereby a channel inlet 30 is formed at one end and a channel outlet 31 is formed at the other end. According to the example, the channel inlet 30 is arranged vertically underneath the channel outlet 31. Adjacent to the channel inlet 30 and/or adjacent to the channel outlet 31 a fan 32 can be arranged in each flow channel 28, as is highly schematically illustrated in FIG. 1.

Figure 2:
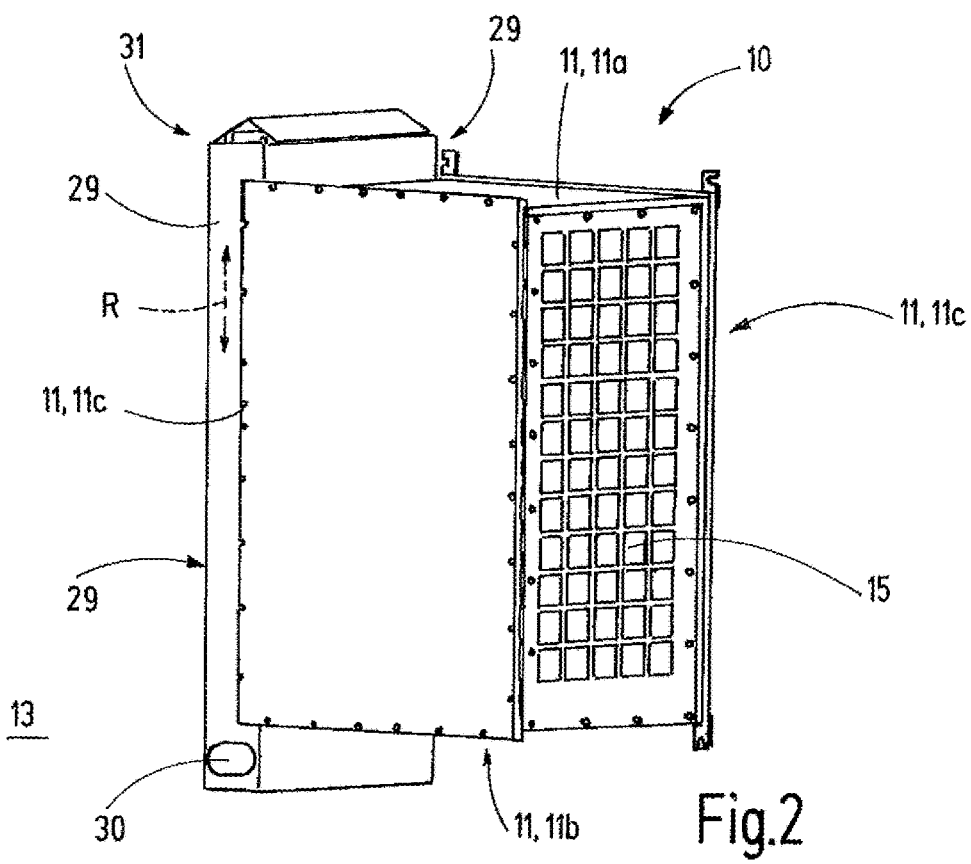

In the embodiment schematically illustrated in FIG. 1 the channel inlet 30 is configured being open downward. Alternatively, the channel inlet 30 could also have one or more inlet openings that are provided in at least one of the guide walls 29 of the guide device 27, as shown in FIG. 2 by way of example.

In order to avoid ingress of precipitation, as rain water, snow or the like in the flow channels, a cover 35 can be present adjacent to the channel outlet 31. The cover 35 guides precipitations laterally past the flow channel 28. The cover 35 is part of the guide device 27. The guide device 27 can thus be configured to direct the main flow direction R through the respective flow channel 28 as well as for realization of an IP-protection class for the housing 10.

In the embodiment according to FIG. 1 the main flow direction R is defined along the respective lateral outer walls 11c and thus along the outer surfaces 26 of the inserts. The main gas flow G passing the inserts 15 thus creates a suction effect in order to entrain gas from the housing interior 12. By means of this gas exchange, heat can be transferred from the housing interior 12 into the environment 13. The devices 14 are thus cooled by means of convection. In the embodiment illustrated in FIG. 1 the suction or chimney effect is further improved in that the main flow direction R is orientated substantially vertically.

It is in addition schematically illustrated in FIG. 1 that at least one fan 32 can be provided also in the housing interior 12 as an option. The at least one fan 32 in the housing interior 12 can be provided in addition or as an alternative to the at least one fan 32 in each flow channel 28. The arrangement of the fan 32 in the housing interior 12 has the advantage that the fan 32 itself must not be configured in an explosion-proof manner.

The embodiments according to FIGS. 1 and 2 are substantially identical. In the embodiment shown in FIG. 1 the channel inlets 30 are arranged on the level of the lower housing wall 11b or slightly above the lower housing wall 11b. Different to this the channel inlets 30 can also be arranged below the lower outer wall 11b by means of an extension of the respective flow channel 28 by means of the guide walls 29. In both embodiments the channel outlets 31 are arranged above the upper housing wall 11a. In modification thereto the channel outlets 31 can also be arranged on the same level as or below the upper outer wall 11a.

Figure 3:
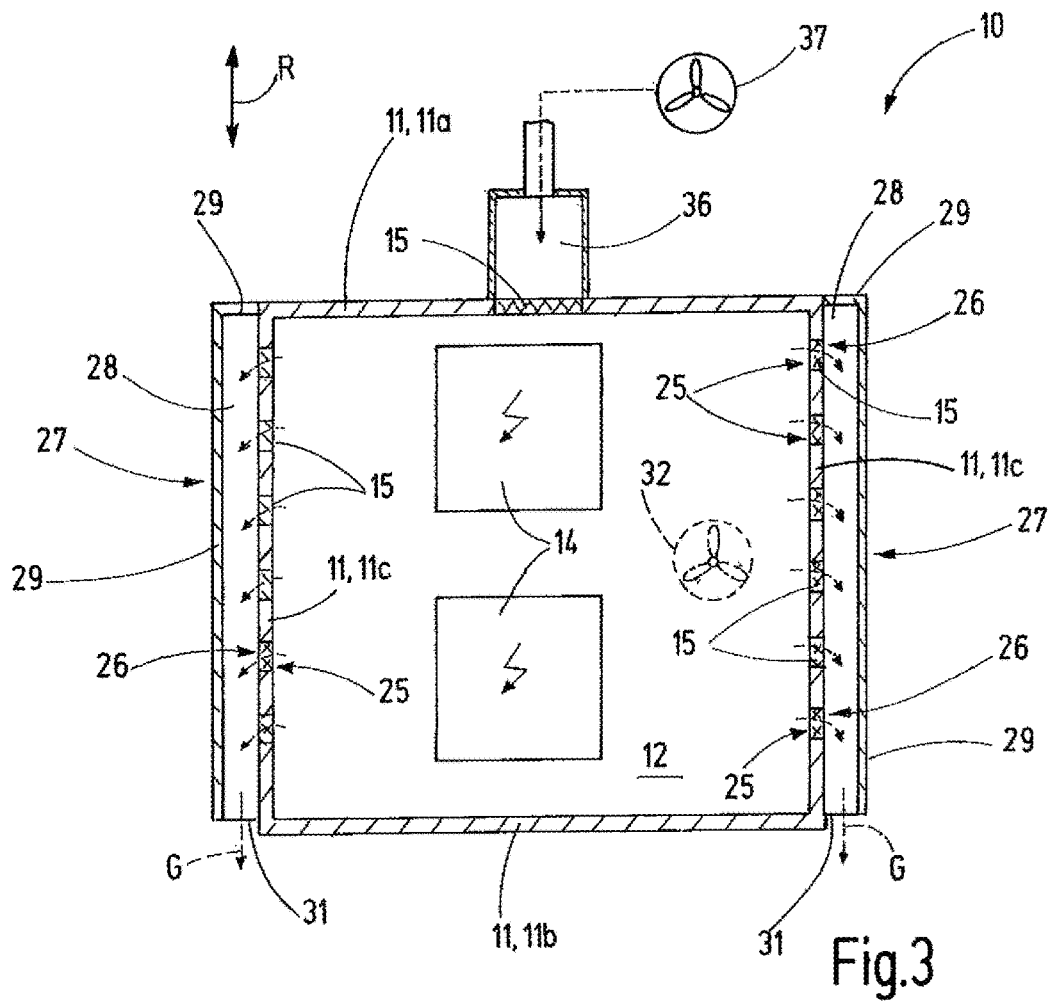
Figure 4:
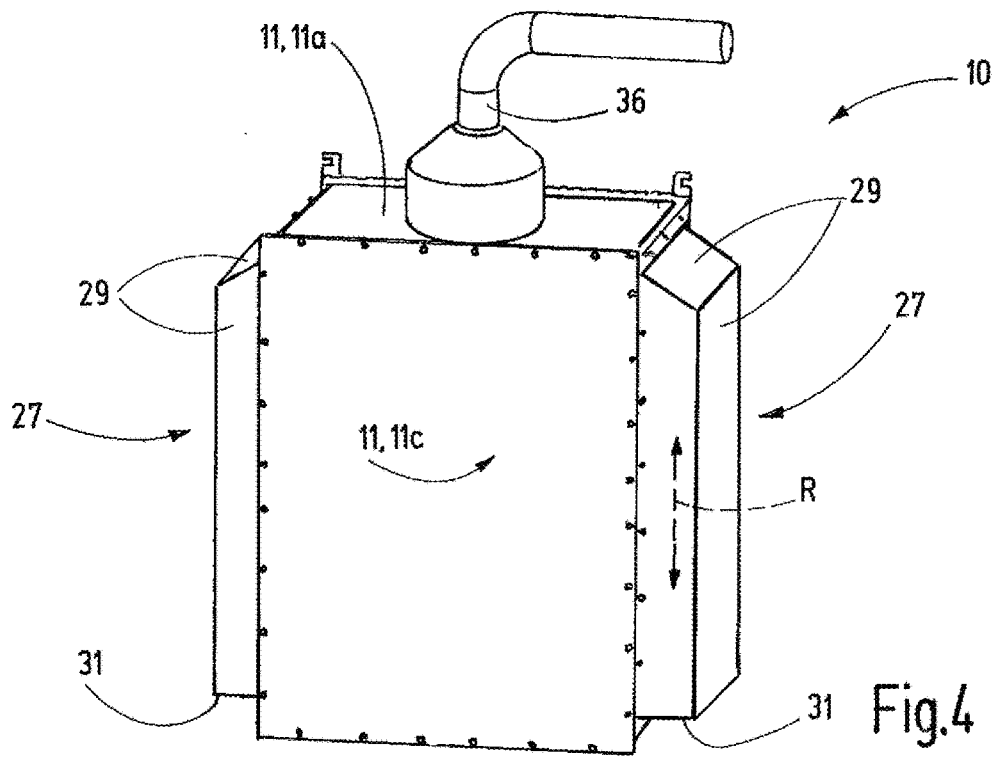

Another embodiment of a housing 10 is illustrated in FIGS. 3 and 4, wherein FIG. 3 shows a block-diagram-like illustration and FIG. 4 shows a perspective illustration of an embodiment. In this embodiment an additional insert 15 is provided in the upper outer wall 11a or at another location, wherein the insert does not adjoin a flow channel 28. Rather the insert 15 provides a flow connection between the housing interior 12 and a separate gas channel 36. In the embodiment the separate gas channel 36 is configured as supply channel and connected to a pressure source 37, e.g. an external fan. For cooling pressurized gas, particularly air, is supplied into the housing interior 12 by means of the pressure source 37. By means of the insert 15 a flameproof connection is established between the gas channel 36 and the housing interior 12.

As in the previous embodiments, flow channels 28 are formed by means of a guide device 27 on two opposite lateral outer walls 11c respectively. The overpressure created in the housing interior 12 by means of the gas supply through the gas channel 36 leads to a gas flow through the at least one insert 15 in the flow channel or flow channels 28. Different to the previous embodiments, the flow channels 28 have only one direct flow connection to the environment 13 by means of a respective channel outlet 31. In the embodiment the channel outlet 31 is arranged in the region of the lower outer wall 11b. In the region of the upper outer wall 11a the flow channels 28 are closed by the guide device 27 according to the example.

Apart therefrom, reference can be made to the explanation of the previous embodiments.

Figure 5:
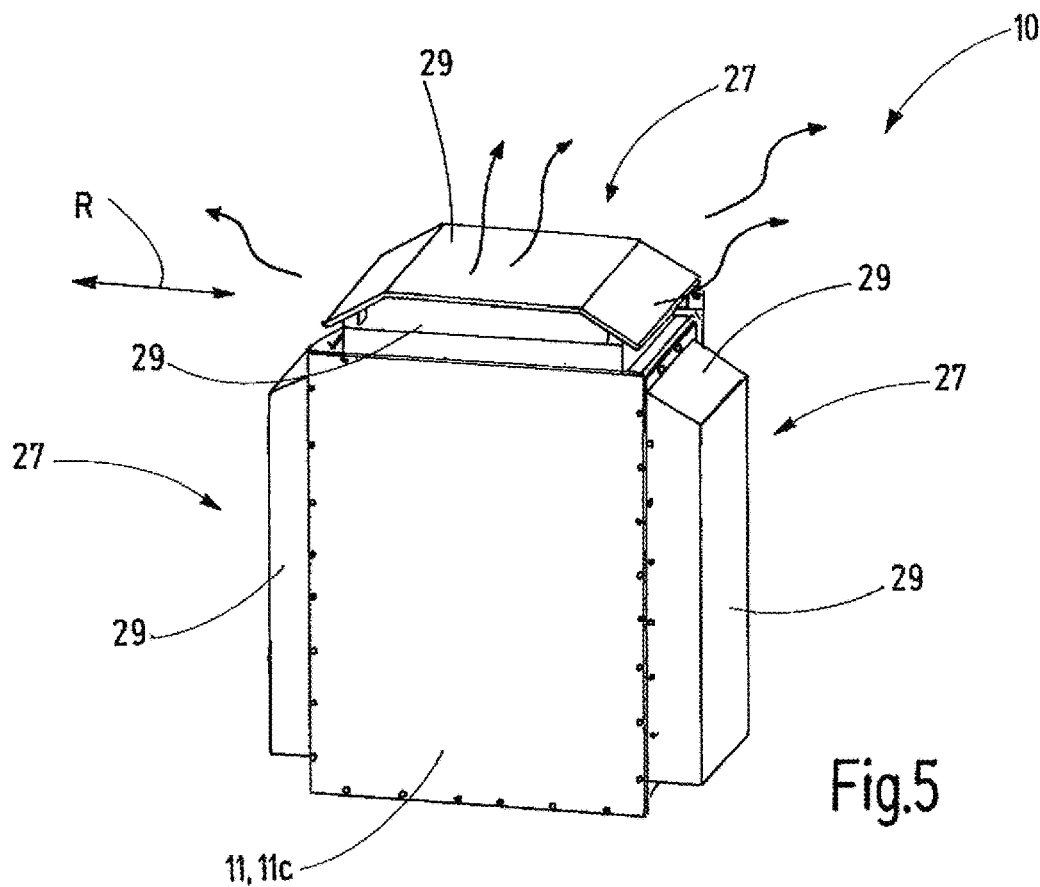
Figure 6:
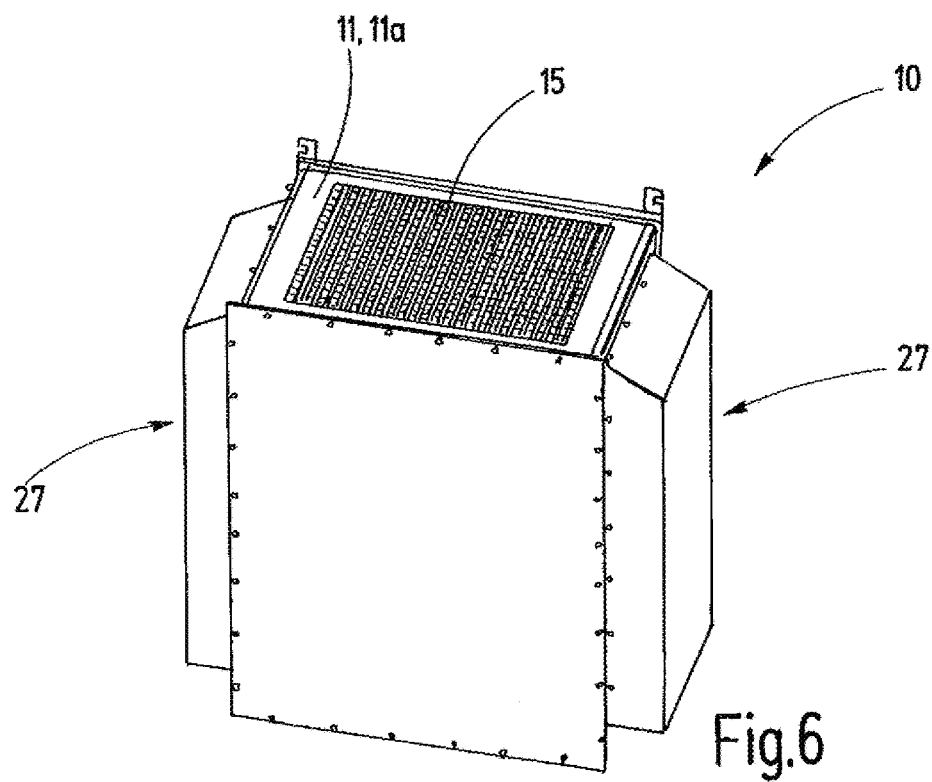

In the embodiments of the housing 10 illustrated in FIGS. 5 and 6, a guide device 27 is arranged on the outside of the upper outer wall 11a. At least one insert 15 is arranged in the upper outer wall 11a. Heat rising in the housing interior can thus pass through the at least one insert 15 into the flow channel 28 formed by the guide device 27. The guide device 27 covers the at least one insert 15 toward the top such that not only a guidance of the main gas flow G is achieved, but in addition an IP-protection can be obtained. The main flow direction R inside the flow channel 28 adjoining the upper outer wall 11a is orientated parallel to the upper outer wall 11a according to the example approximately horizontally.

The two further flow channels or guide devices 27 at the lateral outer walls 11c are optional and can also be omitted in the embodiment according to FIGS. 5 and 6.

Figure 7:
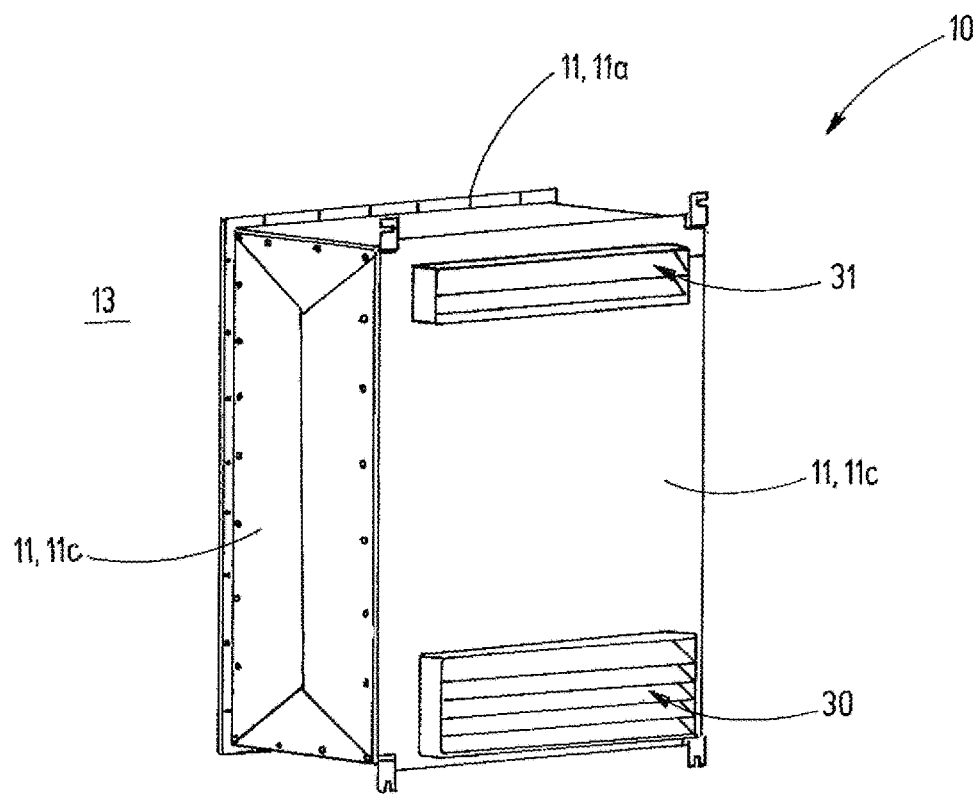
Figure 8:
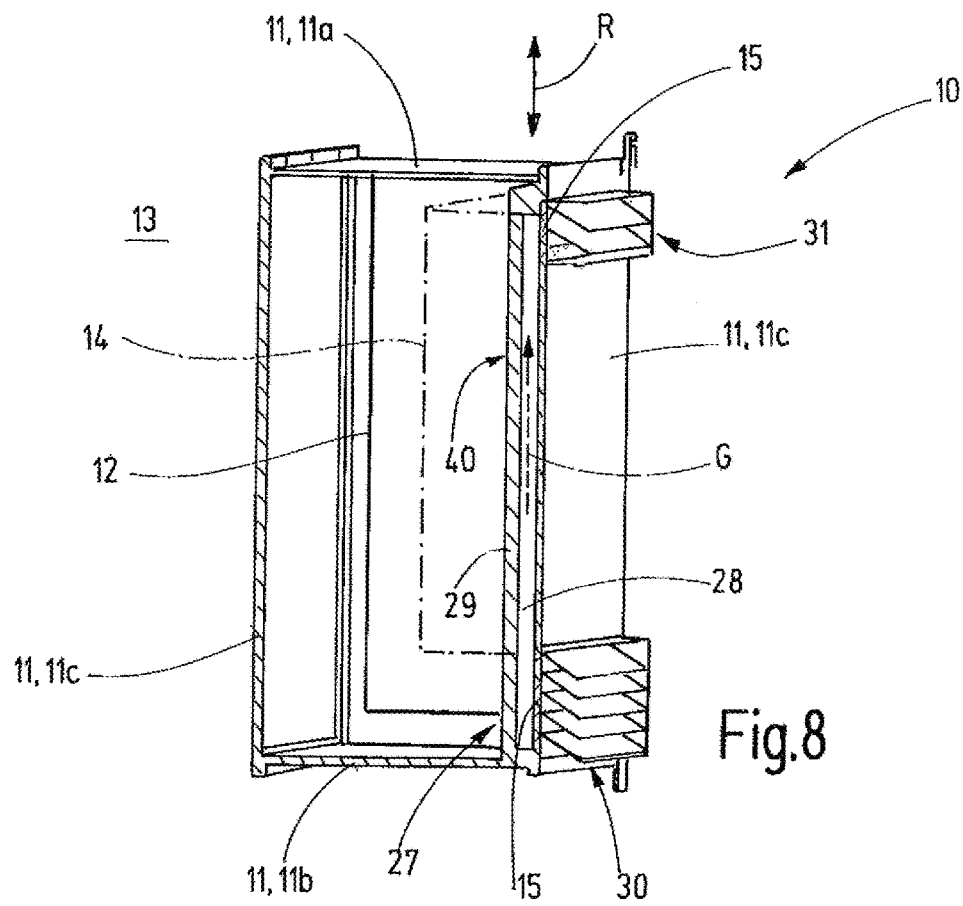
Figure 9:
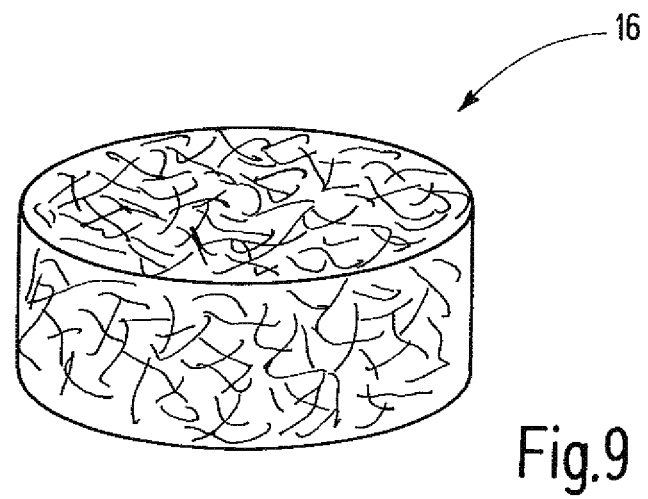

A housing 10 is illustrated in FIGS. 7 and 8 in which the guide device 27 is arranged inside the housing interior 12. A guide wall 29 provides an attachment surface 40 for attachment of a device 14, particularly an electrical and/or electronic device inside the housing interior 12. The guide wall 29 is arranged substantially parallel to the opposite lateral outer wall 11c in the flow channel 28. The channel inlet 30 and the channel outlet 31 are formed in the lateral outer wall 11c limiting the flow channel 28 to the outward by arranging at least one insert 15 in the lateral outer wall 11c respectively. In this embodiment the flow channel 28 comprises a flow connection in the housing interior 12. In modification thereto the flow channel 28 could be at least in sections open with regard to the housing interior 12. By closing the flow channel 28 toward the housing interior 12, a superior main gas flow G can be achieved. As illustrated in FIGS. 7 and 8, the channel outlet 31 is arranged vertically above the channel inlet 30. According to the example, the channel inlet 30 is arranged in the region of the lower outer wall 11b, whereas the channel outlet 31 is arranged in the region of the upper outer wall 11a.

In this embodiment the attachment surface 40 is cooled by the main gas flow G through the flow channel 28. In doing so, heat can be dissipated from the device 14 to the main gas flow G and therefrom to the environment 13.

In a modified embodiment a part of the attachment surface 40 can be omitted and the limitation of the flow channel can be realized not by a guide wall 29, but directly by a wall or an outer surface of the device 14. In addition, this wall or outer surface of the device 14 can also have cooling ribs.

In all embodiments one or more heat sinks can be attached on the at least one device 14 arranged in the housing interior for improving the heat dissipation out of the housing.

In all embodiments at least one flow channel 28 is provided, but also multiple, e.g. two or three, flow channels 28 can be formed by a respective separate guide device 27. Preferably, the present flow channels 28 are arranged adjoining to different outer surfaces 11 of the housing 10. Each flow channel 28 can extend adjoining to an outer wall 11 on the inside or the outside.

In some embodiments the main flow direction R of the main gas flow G is at least in one of or in multiple of the provided flow channels 28 orientated vertically or has a vertical direction component that is greater than a horizontal direction component. In one or more alternative embodiments at least one flow channel is provided in which the main flow direction R is orientated substantially horizontally.

In any of the embodiments described above, the at least one flow channel can be configured in a closed manner between a channel inlet 30 and a channel outlet 31 apart from the gas flow through the at least one insert 15. In the embodiments the at least one insert 15 is preferably arranged between the channel inlet 30 and the channel outlet 31.

The length of the at least one flow channel in main flow direction R is preferably longer than its dimension in the two spatial directions within a cross-sectional plane orthogonal to the main flow direction R. In other words a width and a height in a cross-sectional plane of a flow channel 28 are smaller than a length orthogonal to this cross-sectional plane. Preferably the length of the at least one flow channel 28 is at least as long as 50% to 75% of the length of the directly adjacent outer wall 11 of the housing with view in main flow direction R.

The embodiments described above can be combined with each other. For example, guide devices 27 according to one of the embodiments of FIG. 1 or 2 can be provided on the lateral outer walls 11c in the embodiment according to FIGS. 5 and 6. It is in addition possible that the flow channel 28 provided in the housing interior 12, according to FIGS. 7 and 8, is in addition or as an alternative provided in any other embodiment.

In all embodiments at least one fan 32 can be arranged in at least one provided flow channel 28 and/or in the housing interior 12 respectively, in order to improve the flow behavior. As an alternative, all embodiments can be free of fans 32.

The invention refers to an explosion-proof housing 10 with outer walls 11 that enclose a housing interior 12 relative to an explosive atmosphere in a flameproof manner. At least one insert 15 is arranged in at least one outer wall 11. The insert 15 allows a gas flow between the housing interior 12 and an environment 13 around the housing 10. The at least one insert 15 is configured such that a gas flow with sufficient mass or volume flow is allowed, however, a flameproof flow connection is established. On the outer wall 11 having the at least one insert 15, a guide device 27 is attached that limits a flow channel 28 together with the respective outer wall 11. The flow channel 28 defines a main flow direction R of a main gas flow G through the flow channel 28 substantially parallel to the directly adjoining outer wall 11. In doing so, the gas exchange between the environment 13 and the housing interior 12 can be improved and devices 14 provided in the housing interior 12 can be cooled.

LIST OF REFERENCE SIGNS

10 housing
11 outer wall
11a upper outer wall
11b lower outer wall
11c lateral outer wall
12 housing interior
13 environment
14 device
15 insert
16 porous structure part
17 grid structure part
18 layer
25 inner side
26 outer side
27 guide device
28 flow channel
29 guide wall
30 channel inlet
31 channel outlet
32 fan
35 cover
36 gas channel
37 pressure source
40 attachment surface
G main gas flow
R gas flow direction

The invention claimed is:

1. An explosion-proof housing, comprising:
a plurality of outer walls that enclose a housing interior and separate the housing interior in an explosion-proof manner from an explosive atmosphere in an environment;
at least one gas-permeable flameproof insert provided in at least one of the plurality of outer walls, the at least one gas-permeable flameproof insert having an inner side facing the housing interior and an outer side facing the environment;
at least one guide device defining a flow channel adjacent to either the inner side or the outer side of the at least one gas-permeable flameproof insert in which gas flows through the at least one gas-permeable flameproof insert; and
wherein the at least one guide device is configured to form a main gas flow having a main gas flow direction along the outer side or the inner side of the at least one gas-permeable flameproof insert in the flow channel and the flow channel comprises a channel inlet and a channel outlet arranged with distance to the channel inlet in the main gas flow direction, the channel inlet and the channel outlet open in the environment and the at least one gas-permeable flameproof insert is arranged between the channel inlet and the channel outlet in the main gas flow direction, the channel inlet being arranged vertically below the channel outlet and the at least one guide device having multiple guide walls that enclose the flow channel in a circumferential direction around the main gas flow direction only on three sides and limit the flow channel together with an adjacent one of the plurality of outer walls.

2. The explosion-proof housing according to claim 1, wherein the guide device is arranged outside the housing interior and comprises a cover.

3. The explosion-proof housing according to claim 1, wherein a length of the flow channel in the main gas flow direction is about 50% to 75% of a length of the at least one of the plurality of outer walls the at least one gas-permeable flameproof insert is provided in.

4. The explosion-proof housing according to claim 1, wherein a cross-section of the flow channel is smaller than a sum of all outer or inner surfaces of the at least one gas-permeable flameproof insert adjoining the flow channel.

5. The explosion-proof housing according to claim 1, wherein the channel inlet or the channel outlet is formed by the at least one gas-permeable flameproof insert.

6. The explosion-proof housing according to claim 1, wherein gas flows in or out of the flow channel only through at least one gas-permeable flameproof insert between the channel inlet and the channel outlet and apart therefrom the flow channel is closed.

7. The explosion-proof housing according to claim 1, wherein multiple separate flow channels are provided.

8. The explosion-proof housing according to claim 1, wherein a fan is arranged in the flow channel.

9. The explosion-proof housing according to claim 1, wherein a separate gas channel is in flow connection with the housing interior in a flameproof manner and supplies air or gas in the housing interior or sucks air or gas out of the housing interior.

10. The explosion-proof housing according to claim 1, wherein the at least one gas-permeable flameproof insert is provided in an upper outer wall of the plurality of outer walls.

11. The explosion-proof housing according to claim 1, wherein the at least one gas-permeable flameproof insert is provided in at least one lateral outer wall of the plurality of outer walls.

12. The explosion-proof housing according to claim 11, wherein at least one gas-permeable flameproof insert is provided in two opposite lateral outer walls respectively of the plurality of outer walls.

13. The explosion-proof housing according to claim 1, wherein the flow channel is arranged inside the housing interior and the at least one guide device comprises an attachment surface for a device to be cooled.

14. The explosion-proof housing according to claim 1, wherein the flow channel is arranged inside the housing interior and a section of the guide device is formed by a wall of a device arranged in the housing interior.

15. The explosion-proof housing according to claim 2, wherein a length of the flow channel in the main gas flow direction is about 50% to 75% of a length of the at least one of the plurality of outer walls the at least one gas-permeable flameproof insert is provided in.

16. The explosion-proof housing according to claim 15, wherein a cross-section of the flow channel is smaller than a sum of all outer or inner surfaces of the at least one gas-permeable flameproof insert adjoining the flow channel.

17. The explosion-proof housing according to claim 16, wherein the flow channel comprises a channel inlet and a channel outlet arranged with distance to the channel inlet in the main gas flow direction.

18. The explosion-proof housing according to claim 17, wherein the channel inlet and the channel outlet open in the environment and that the at least one gas-permeable flameproof insert is arranged between the channel inlet and the channel outlet in the main gas flow direction.

19. An explosion-proof housing, comprising:
- a plurality of outer walls that enclose a housing interior and separate the housing interior in an explosion-proof manner from an explosive atmosphere in an environment;
- at least one gas-permeable flameproof insert provided in at least one of the plurality of outer walls, the at least one gas-permeable flameproof insert having an inner side facing the housing interior and an outer side facing the environment;
- at least one guide device defining a flow channel adjacent to either the inner side or the outer side of the at least one gas-permeable flameproof insert in which gas flows through the at least one gas-permeable flameproof insert; and
- wherein the at least one guide device is configured to form a main gas flow having a main gas flow direction along the outer side or the inner side of the at least one gas-permeable flameproof insert in the flow channel and the flow channel is arranged inside the housing interior and the at least one guide device comprises an attachment surface for a device to be cooled.

20. An explosion-proof housing, comprising:
- a plurality of outer walls that enclose a housing interior and separate the housing interior in an explosion-proof manner from an explosive atmosphere in an environment;
- at least one gas-permeable flameproof insert provided in at least one of the plurality of outer walls, the at least one gas-permeable flameproof insert having an inner side facing the housing interior and an outer side facing the environment;
- at least one guide device defining a flow channel adjacent to either the inner side or the outer side of the at least one gas-permeable flameproof insert in which gas flows through the at least one gas-permeable flameproof insert; and
- wherein the at least one guide device is configured to form a main gas flow having a main gas flow direction along the outer side or the inner side of the at least one gas-permeable flameproof insert in the flow channel and the flow channel is arranged inside the housing interior and a section of the guide device is formed by a wall of a device arranged in the housing interior.

* * * * *